United States Patent
Yang et al.

(10) Patent No.: US 7,564,134 B2
(45) Date of Patent: Jul. 21, 2009

(54) CIRCUIT WIRING LAYOUT IN SEMICONDUCTOR MEMORY DEVICE AND LAYOUT METHOD

(75) Inventors: Hyang-Ja Yang, Suwon-si (KR); Song-Ja Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 264 days.

(21) Appl. No.: 11/259,401

(22) Filed: Oct. 26, 2005

(65) Prior Publication Data
US 2006/0098469 A1      May 11, 2006

(30) Foreign Application Priority Data
Nov. 5, 2004    (KR)    ............. 10-2004-0089600

(51) Int. Cl.
*H01L 23/48*    (2006.01)
*H01L 29/40*    (2006.01)
*H01L 23/52*    (2006.01)
*G01L 5/06*    (2006.01)

(52) U.S. Cl. ............... 257/758; 257/903; 257/E27.098; 365/63

(58) Field of Classification Search .......... 365/63; 257/758, 903, E27.098
See application file for complete search history.

(56) References Cited

U.S. PATENT DOCUMENTS

| 5,422,839 | A | * | 6/1995 | Ishibashi et al. ............ 365/51 |
| 5,995,439 | A | * | 11/1999 | Watanabe et al. ...... 365/230.03 |
| 2001/0013659 | A1 | * | 8/2001 | Noda et al. ................. 257/758 |

* cited by examiner

*Primary Examiner*—Anh Phung
*Assistant Examiner*—Allison P Bernstein
(74) *Attorney, Agent, or Firm*—F. Chau & Associates, LLC

(57) ABSTRACT

An improved circuit wiring layout provides smooth circuit wiring in a peripheral circuit region adjacent to a memory cell region of a semiconductor memory device, and eliminates a write-speed limiting factor. Forming a metal (instead of a metal silicided polysilicon) wiring layer to be connected to a gate layer, to transmit an electrical signal to the gates of FET (e.g., MOSFET (Metal Oxide Semiconductor Field Effect Transistor) transistors formed in the peripheral circuit region; the metal wiring layer is formed (e.g., using one metal damascene process), on a layer different from a word line layer formed on the gate layer (e.g., using another metal damascene process), thereby obtaining a layout of a peripheral circuit region having a reduced area and without using a silicide process.

20 Claims, 13 Drawing Sheets

CIRCUIT WIRING LAYOUT IN SEMICONDUCTOR MEMORY DEVICE AND LAYOUT METHOD

The present invention relates to a semiconductor memory, and more particularly, to a circuit layout in a SRAM semiconductor memory device.

BACKGROUND

Very large scale integration, (VLSI), has allowed the electronics industry to reduce cost while continuing to increase chip performance and chip reliability. The performance of SRAM (Static Random Access Memory) chips may also be increased by reducing the device dimensions.

Volatile semiconductor memory devices such as SRAMs are achieving higher speed and integration (miniaturization), corresponding to a growing demand for higher performance electronic systems such as personal computers or electronic communication equipments (e.g., cell phones, PDAs, etc.). Manufacturers of memory chips are making great efforts to improve the layout and manufacture of memory cells and peripheral circuits (which select and read the memory cells, such as sense amplifiers) connected with the memory cells, by reducing their dimensions. A circuit wiring layout technique in a peripheral circuit region has an important impact on the integration (miniaturization) level, the peripheral circuit region being adjacent to a memory cell (array) region where the size of memory cells is reduced by advanced process techniques.

FIG. 1 is a block diagram illustrating a semiconductor memory device including its memory cell array and its peripheral circuit blocks. Referring to FIG. 1, the device includes a memory cell array 110 having a plurality of memory cell blocks each constructed of a plurality of memory cells; an X decoder 130 for selecting a row of memory cells; a Y decoder 140 for selecting a column of memory cells (disposed in the memory cell array 110); a column (Y) gating block 120 connected to the Y decoder 140, to designate a column (Y) path of the memory cell array 110; a block write driver 150 connected to the column (Y) gating block 120, to provide write data to a memory cell; and a block sense amplifier (S/A) 160 connected to the column (Y) gating block 120, to sense and amplify (read) data stored in a memory cell.

FIG. 2 is a circuit diagram of a representative portion of the column (Y) gating block 120 shown in FIG. 1. FIG. 2 shows, for illustrative convenience, a pair of circuit wiring structures connected with two mutually adjacent memory cells 1a and 1b (within the memory cell array 110). Referring to FIG. 2, a precharge and equalization part 122a and a read and write path switching part 124a are connected to a first bit line pair BL0, BL0B of the first memory cell 1a. A second bit line pair BL1, BL1B (of the second memory cell 1b) is connected with a similar precharge and equalization part 122b and a read and write path switching part 124b.

A pair of P-type FET (e.g., MOS; MOSFET Metal Oxide Semiconductor Field Effect Transistor) transistors Tp00 and Tp01 (in the precharge and equalization part 122a) precharge the first bit line pair BL0, BL0B to a power source voltage VDD, and a P-type MOS equalizing transistor Te0 maintains the paired bit lines BL0 and BL0B at the same voltage potential during an equalization operation. Similarly, a second pair of P-type MOS transistors Tp10 and Tp11 (in the precharge and equalization part 122b) are precharge transistors for precharging the bit line pair BL1, BL1B to the power source voltage VDD, and a P-type MOS transistor Te1 is an equalizing transistor for maintaining the second pair of bit lines BL1 and BL1B at the same potential (relative to each other) during an equalization operation.

In the read and write path switching part 124a, P-type MOS transistors Tr0 and Tr0B are turned ON for a read operation, to transfer potentials appearing on the bit line pair BL0, BL0B to a read related circuit such as a sense amplifier etc.; and N-type MOS transistors Tw0, Tw0B are turned ON during a write operation, to transfer an applied write data to the bit line pair BL0, BL0B.

Similarly, in the read and write path switching part 124b, P-type MOS transistors Tr1 and Tr1B are read path switching transistors that are turned ON during a read operation to transfer potentials appearing on the bit line pair BL1, BL1B to a read related circuit such as a sense amplifier etc.; and N-type MOS transistors Tw1, Tw1B are write path switching transistors that are turned ON during a write operation to transfer an applied write data to the bit line pair BL1, BL1B.

FIG. 3 is a circuit diagram of a conventional six-transistor SRAM (static random access memory) cell for implementing the volatile memory cells shown in FIG. 2.

The circuit structure for each of the memory cells 1a and 1b shown in FIG. 2 may be a conventional CMOS (Complementary Metal Oxide Semiconductor) SRAM (Static Random Access Memory) cell constructed of six transistors M1-M4, P1 and P2, as shown in FIG. 3. If the cell pitch of SRAM cell is reduced down to the approximate resolution limit of a photolithography process, the six transistors may be disposed on mutually different layers instead of a disposition on the same layer.

Regardless of the disposition of transistors constituting the memory cell on the same layer or mutually different layers, when the cell pitch of a memory cell is reduced, it is more difficult to form similarly sized transistors constituting the precharge and equalization part and the read and write path switching part. It is difficult to form the P-type and N-type transistors shown in FIG. 2, matching the pitch size of a minimal pitch memory cell.

Further, signal lines of column decoding signals Y0 and Y1 among signal lines of column decoding signals Y0, Y0B, Y1 and Y1B of FIG. 2 must be respectively connected with connection nodes co1 and co2 of FIG. 2, thus the line loading is large. Since parasitic resistances PR1, PR2, PR11 and PR22 may have very large values, errors in write operation may occur.

Meanwhile, a row decoder section 130a in being a portion of) the X decoder 130 of FIG. 1 may have a circuit wiring structure as illustrated in FIG. 8. The row decoder section 130a (FIG. 8) formed in a functional circuit region near a memory cell region can be constructed of four (inverting) drivers in a case where four subword lines SWL0-SWL3 are connected to one corresponding main word line MWL 100. If the cell pitch of memory cells connected to the subword lines SWL0-SWL3 is minimized, it is very important to form input lines 60, 61, 62 and 63 of the drivers. Each of input lines 60, 61, 62 and 63 individually transmits a block selection (BLK-SEL) signal SiDi corresponding to a selection signal to a respective one of the subword lines SWL0-SWL3 of FIG. 8. In other words, it is very difficult to form P-type transistors 10-13 and N-type transistors 20-23 (constituting the drivers and their input/output wires) that match a minimized memory cell pitch.

FIGS. 4A and 4B are plan views of a conventional layout of the conventional circuit of FIG. 2. Memory cells 1a and 1b of FIG. 4A respectively correspond to memory cells 1a and 1b of FIG. 2, and equalization transistors Te0 and Te1 are formed (elongated) in a Y direction in a region S10 (for convenience, an X direction is called a first direction and a Y direction is called a second direction). The reference number 2 (e.g., in the region S10) indicates a P-type (semiconductor) active region formed in or on a (semiconductor) substrate, and a reference symbol WC of the rectangular elements indicates that they are tungsten contacts. An "active region" means an area within which transistors or other active devices reside. The tungsten contacts WC electrically connect metal layers (corresponding to drain and source regions of the equalization transistors Te0 and Te1) to the Bit line pairs BL0-BL0B and BL1-BL1B, respectively.

Bit line pairs BL0-BL0B and BL1-BL1B shown in FIGS. 4A & 4B are depicted by dotted lines (rectangles extending in the second (Y) direction). Each gate (layer) is formed of a layer of polysilicon, which is often called a "gate poly" by those skilled in the art, and is depicted by a solid perimeter line (hatched in a diagonal pattern) along (a rectangle elongated in the second (Y) direction in the region S10). For convenience, reference characters indicating the equalization transistors Te0 and Te1 are labeled on the gates (e.g., poly (GP) layer) of the equalization transistors Te0 and Te1, in FIG. 4A.

A transistor gate electrode (e.g., a polysilicon gate electrode) is an electrode that regulates the flow of current in a MOSFET (MOS) transistor. The gate electrode of a MOSFET controls the flow of electrical current through the channel between the source and the drain. A thin, high-quality silicon dioxide film called a gate oxide separates the (poly) gate electrode of a MOS transistor from the electrically conducting transistor channel.

The precharge transistors Tp00, Tp01, Tp10 and Tp11 of FIG. 2 are disposed in a region S11 shown in FIG. 4A, and in regions S12 and S13 of FIG. 4B. Write path switching transistors Tw0 and Tw1 and write path switching transistors Tw0B and Tw1B are respectively disposed in regions S12 and S13 of FIG. 4B. In general, the write path switching transistors Tw0, Tw1, Tw0B and Tw1B are disposed within N-type semiconductor active regions, denoted by numeral 4.

Further, read path switching transistors Tr0 and Tr1 and read path switching transistors Tr0B and Tr1B are respectively disposed in P-type active regions, denoted by numeral 2 in regions S14 and S15 of FIG. 4B.

Polysilicon wiring lines for individually transmitting column decoding signals Y0 and Y1 (to the gates of transistors) are indicated by reference symbols Y0 and Y1 in FIG. 4B, and are disposed in the second (Y) direction through a medium region between (outside of) active regions S14 and S15. Polysilicon wiring lines for individually transmitting column decoding signals Y0B and Y1B are indicated by reference characters Y0B and Y1B in FIG. 4B, and are elongated in the second (Y) direction in a device isolation region between the two N-type active regions 2 in the regions S14 and S15.

As shown in FIGS. 4A and 4B, when the cell pitch of memory cells (see FIG. 2) is reduced, the size of the peripheral circuit of FIG. 2 is remarkably reduced in a first dimension (X direction), and thus it is very difficult to form the column (Y) gating transistors shown in FIG. 2 appropriate for the reduced pitch size of the scaled-down memory cells. This is because the polysilicon wiring lines must be formed on a device isolation region between two active regions 2 (in the regions S14 and S15 of) as shown in FIG. 4B.

In forming the peripheral circuit of FIG. 2 as shown in FIGS. 4A and 4B, an overall size in a second dimension (Y direction) may be 50 microns, and thus it is difficult to rapidly transmit column decoding signals Y0 and Y1 to gates of the equalization transistors Te0 and Te1 (due to a line loading). And thus, a write operation error may be caused. This will be described more in detail below.

Referring to FIGS. 2, 4A and 4B, during a no-operation mode in which no access (read or write) operation is performed, a column decoding signal Y0,Y1 is applied as a logic low state, and a column (Y) decoding signal Y0B, Y1B is applied as a logic high sate. The column decoding signals are outputted from a column decoder 140 shown in FIG. 1. Then, transistors Tp00, Tp01, Te0, Tp10, Tp11 and Te1 within precharge and equalization parts 122*a* and 122*b* are all turned ON, and thus bit line pairs BL0-BL0B and BL1-BL1B respectively connected with memory cells 1*a* and 1*b* are all precharged to the level of the power source voltage VDD.

When a read command selecting the memory cell 1*a* is performed (in a read operation mode), the column decoding signal Y0B is applied in a logic high state. Thus, transistors Tr0 and TR0B in a read and write path switching part 124*a* are turned ON, and memory cell potentials developed to the bit line pair is provided to a read related circuit such as a sense amplifier etc., to perform a data read operation.

Meanwhile, when a write command selecting the memory cell 1*a* is performed (in a write operation mode), the column decoding signal Y0 is applied in a logic high state. Then, transistors Tw0 and TW0B within a read and write path switching part 124*a* are turned ON, and applied write data is stored at the cell 1*a* through the bit line pair. While performing such write operation (in a write operation mode), all of the transistors Tp00, Tp01 and Te0 of the precharge and equalization part 122*a* should be OFF. The transistors Tw0 and Tw0B should be turned ON as rapidly as possible, and the precharge equalization transistors Tp00, Tp01 and Te0 should be turned OFF as quickly as possible, so as not to interfere with a write operation. In the case where wiring lines transmitting the column decoding signals Y0 and Y1 have a relatively large resistance component, the write operation is not performed smoothly. Generally, wiring lines transmitting the column decoding signals Y0, Y1 are made of a polysilicon layer having a silicide layer. Herewith, in the case that a silicide process is not well performed, a (sheet) resistance value of the wiring line may amount to several decades to hundreds of ohms. When the silicide layer is formed satisfactorily on the polysilicon layer through a reaction with heat-resisting metal such as tungsten or titanium etc., a (sheet) resistance value of the wiring line is about 60 ohms, but in case the silicide process is not well performed owing to a very small critical dimension of the polysilicon layer, the (sheet) resistance value may increase by hundreds of times. Herewith, in the circuit layout as shown in FIGS. 4A and 4B, a pattern variation of the polysilicon layer in the second (Y) direction is severe. A more serious variation of critical dimension for a gate poly makes a silicide process not well performed (not smooth).

If the silicide process is performed unstably, a wiring line transmitting a signal such as the column (Y) decoding signal has a large resistance-loading, thus may cause error in a write operation. In other words, in a conventional technology referred to in FIGS. 4A and 4B a column fail rate may increase with a great reduction of manufacturing yield.

SUMMARY OF THE INVENTION

It is desirable to develop techniques to not only efficiently form transistors of a limited size constituting a column (Y) gating block 120 and constituting a row decoder section 130*a* (a section of X decoder 130) as shown in FIG. 1, but also to appropriately form wiring layers necessary for the operation of the transistors so as to match the minimized cell pitch of highly-integrated memory cells (e.g., in conformity with a three-dimensional memory cells, in which transistors constituting an SRAM cell are formed on different layers, and in which a memory cell core region of a chip associated with the memory cells also becomes smaller).

An exemplary embodiment of the invention provides a circuit layout structure and layout method for a semiconductor memory device, which is capable of reducing the area occupied by a peripheral circuit region adjoining a memory cell region.

Another exemplary embodiment of the invention provides a circuit wiring layout structure capable of smoothly performing a wiring layout of circuit at a peripheral circuit region adjacent to a memory cell region of a semiconductor memory device, and of solving one write speed limiting factor.

Another exemplary embodiment of the invention provides a circuit layout structure and method in a semiconductor memory device, which is capable of substantially reducing a resistive line loading of column decoding signal lines in a column (Y) gating block, thereby preventing a write error. Further, transistors constituting a row decoder section, and wiring layers necessary for the operation of the row decoder section, can be configured appropriately to match the cell pitch of high-integrated memory cell. Transistors constituting a column (Y) gating block, and transistors constituting a row decoder section, can be disposed more efficiently in a limited size, and wiring layers necessary for the operation of the transistors can be formed to correspond to the reduced cell pitch of memory cells high-integrated in two or three dimensions, in a volatile semiconductor memory device.

According to an aspect of the invention, a circuit wiring layout in a semiconductor memory device is characterized in that a metal wiring layer is formed (e.g., by using one metal damascene process), at a layer different from a word line layer formed (e.g., by using another metal damascene process) on a gate layer. The metal wiring layer is electrically connected to the gate electrodes (in the gate layer) and transmit an electrical signal to the gate electrodes of MOS transistors formed in a peripheral circuit region adjacent to a memory cell region of static RAM memory cells.

Beneficially, the static RAM (SRAM) memory cells are individually constructed of six cell transistors, and the six cell transistors can be formed on the same layer or on different layers. The MOS transistors formed in the peripheral circuit region may be P-type and N-type MOS transistors used in constructing a column (Y) gating block or a row decoder. The gate layer can be constructed of a polysilicon layer, and the word line layer and the metal wiring layer each can both be constructed of different layers of tungsten (metal). The metal wiring layer may be a metal layer for transmitting a column (Y) decoding signal or a section row decoding related signal, and may be disposed under a bit line layer made of metal.

According to another aspect of the invention, a circuit wiring layout structure includes first and second Static RAM (Random Access Memory) memory cells disposed adjacent to each other in a first direction (within a memory cell region/array); first and second P-type MOS transistors, which are formed in a region of a peripheral circuit adjacent to the memory cell region) and elongated in a second direction (e.g., a word line layout direction), and which are electrically connected respectively to first and second subword lines corresponding to the first and second static RAM memory cells; first and second N-type MOS transistors, which are distanced (separated) by a determined distance in the second direction from a region (of the peripheral circuit) where the first and second P-type MOS transistors are formed (yet within peripheral circuit), and which are formed electrically connected respectively to the first and second word lines; a first metal (e.g., damascene) wiring line (elongated or extending in the second direction between the two (N & P) active regions of the peripheral circuit), which electrically connects a gate layer (electrode) of the first P-type MOS transistor with a gate layer (electrode) of the first N-type MOS transistor and which is formed at the same layer where the first and second word lines are formed; and a second metal (e.g., damascene) wiring line, which electrically connects a gate layer (electrode) of the second P-type MOS transistor with a gate layer (electrode) of the second N-type MOS transistor, (elongated or extending in the second direction between the two (N & P) active regions of the peripheral circuit) and which is parallel with the first metal wiring line (and at the same layer).

BRIEF DESCRIPTION OF THE DRAWINGS

Exemplary embodiments of the present invention are more fully described below with reference to the accompanied drawings in which like components having like functions have been provided with like reference symbols and numerals. This invention may, however, be embodied in many different forms and should not be construed as being limited to the exemplary embodiments set forth herein; rather, these exemplary embodiments are provided to conveys the concepts of the invention to those skilled in the art.

In the drawings.

DETAILED DESCRIPTION OF EXEMPLARY EMBODIMENTS OF THE INVENTION

Figure 6:
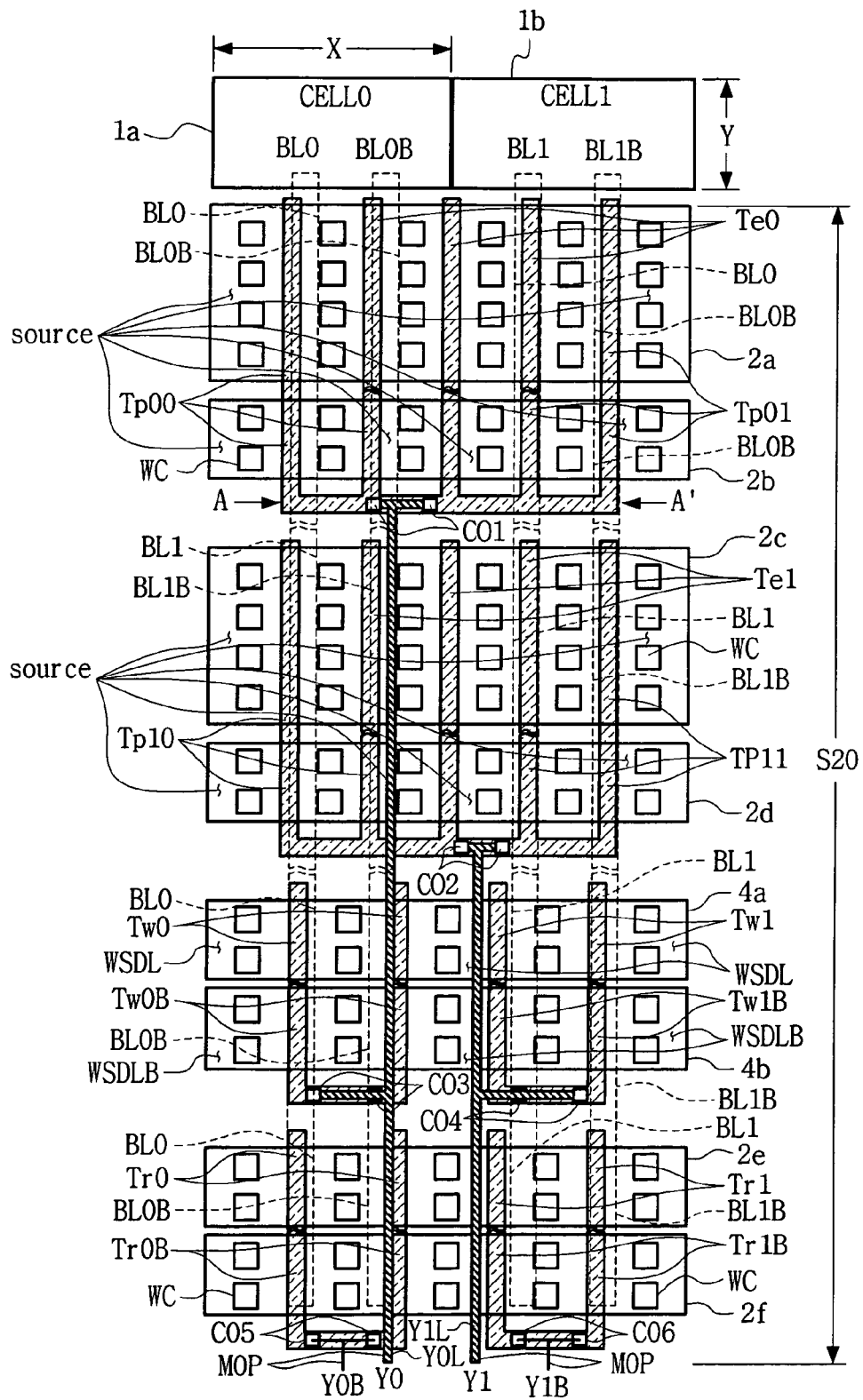
FIG. 6 is a plan view for a layout of circuits shown in FIG. 2 according to an exemplary embodiment of the invention.

A first exemplary embodiment of the invention is shown in FIG. 6.

Figure 2:
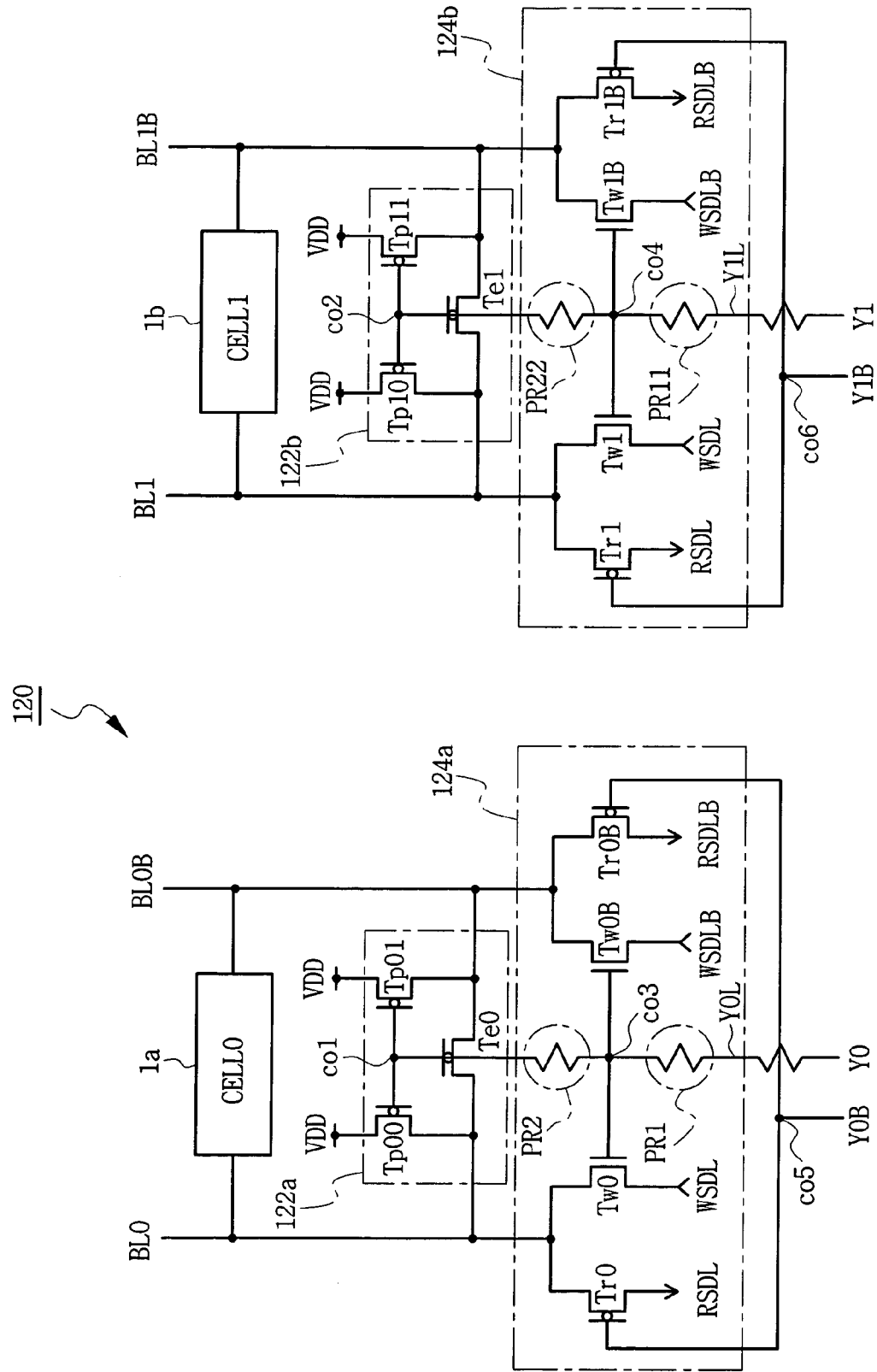
FIG. 2 is a circuit diagram of a representative portion of a general column (Y) gating block shown in FIG. 1.

FIG. 6 is a plan view for a layout of the circuit shown in FIG. 2 according to an exemplary embodiment of the invention. The overall size (dimension S20) of second dimension (Y direction) is about 17 microns. The wiring lines transmitting column (Y) decoding signals are not formed by a silicide process. The layout structure shown in FIG. 6 may be applied to a device having memory cells having a vertical structure as shown in 5B (part of FIG. 5). The vertical structure of a memory cell region in a highly-integrated memory cell may vary between 5a and 5b shown in FIG. 5. It is beneficial to use a metal zero prime layer MOP (as any optional wire in a peripheral circuit region).

Figure 5:
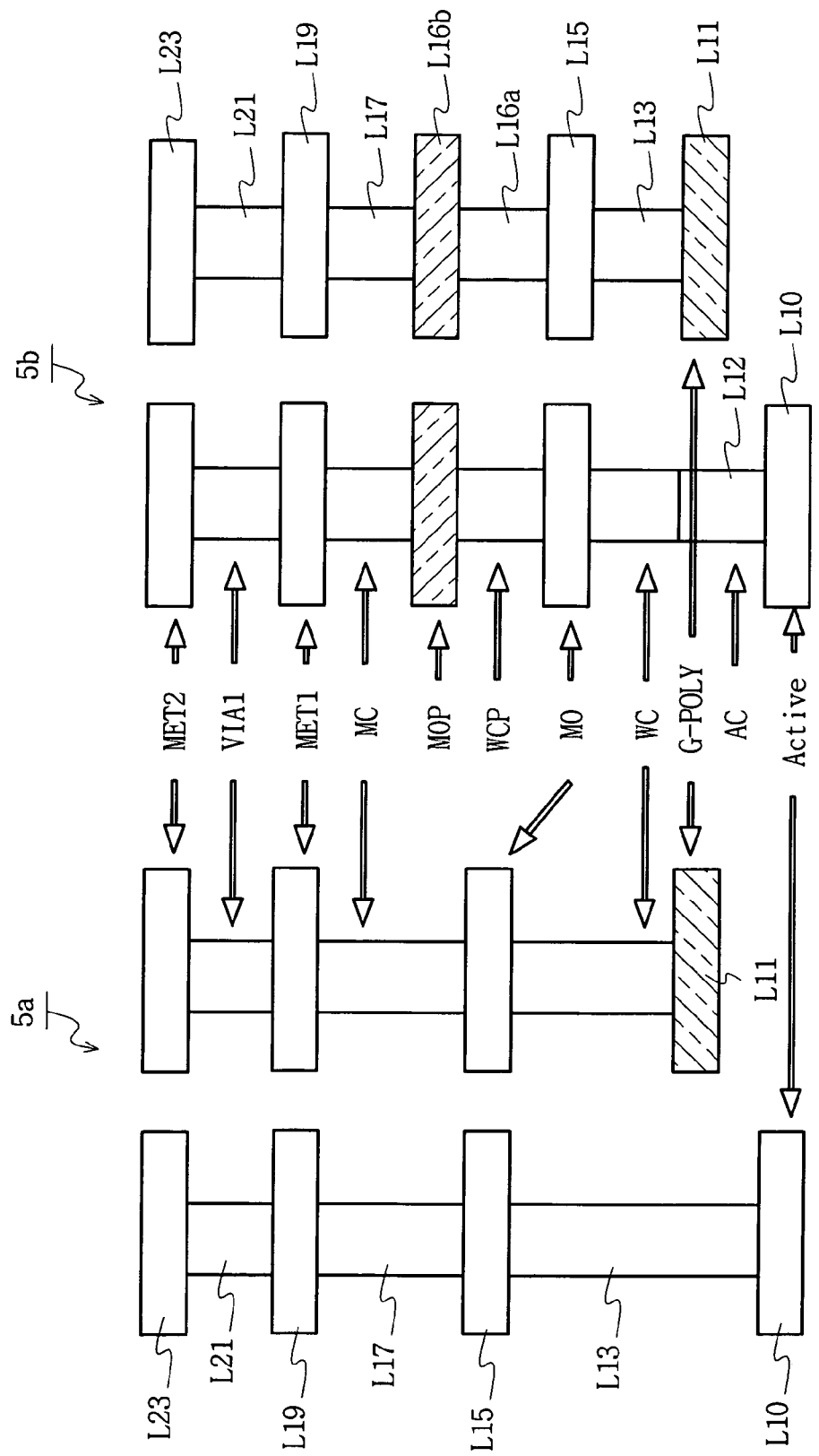
FIG. 5 illustrates a vertical layer structure of circuit in a process according to an exemplary embodiment of the invention.

Referring to FIG. 5, in the conventional SRAM (see FIG. 3), an active layer L10 is connected to a metal zero layer M0;L15 through a tungsten contact L13, and the metal zero layer L15 is connected to a first metal layer L19 through a metal contact L17, in 5a of FIG. 5 where a gate poly layer L11 is not shown. First metal layer M1:L19 is coupled with a second metal layer M2:L23 through a via contact L21. The gate poly layer L11 is coupled with a metal zero layer M0:L15 through a tungsten contact L13, in 5a of FIG. 5 illustrating the gate poly layer L11.

Figure 3:
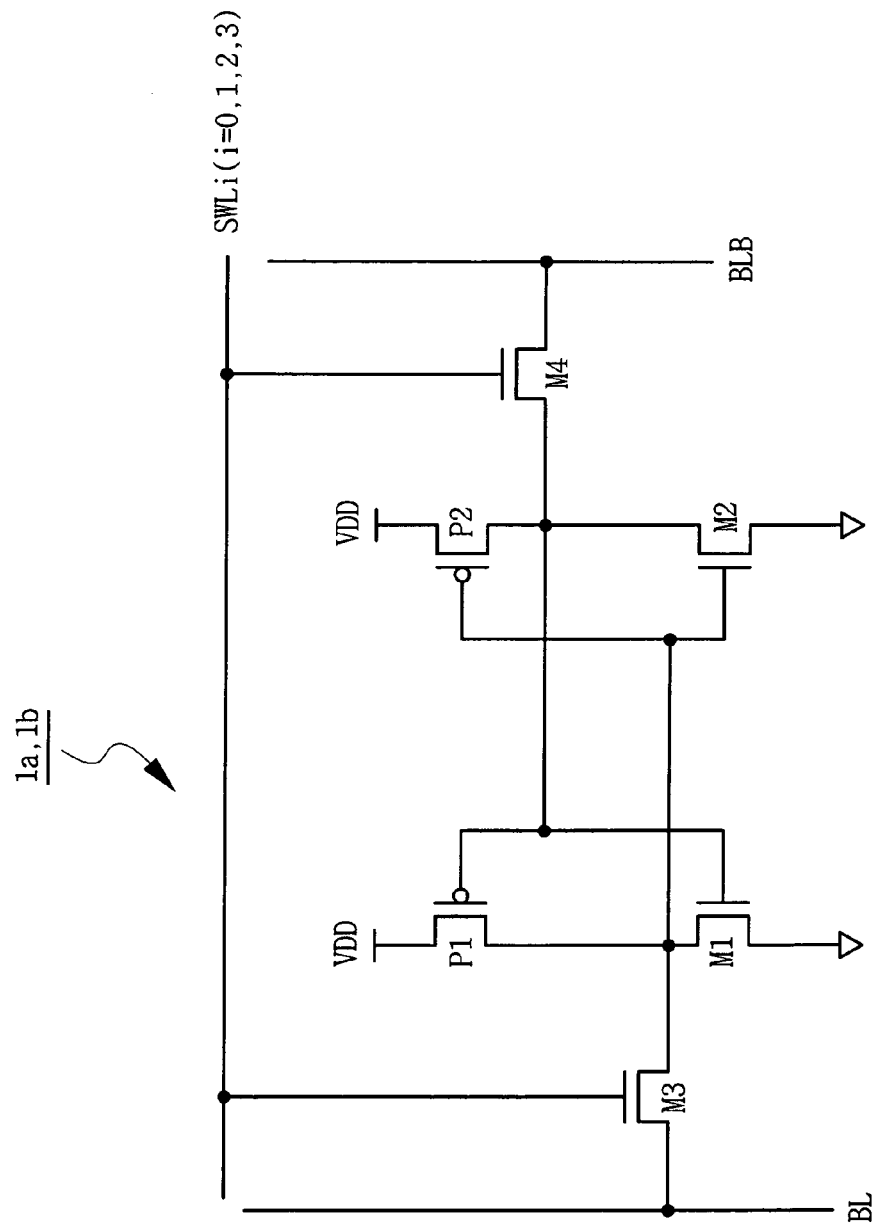
FIG. 3 is a circuit diagram of a conventional six-transistor SRAM memory cell for implementing the memory cells shown in FIG. 2.

In a vertical structure of the SRAM circuit shown in FIG. 3, as further illustrated in 5b of FIG. 5, a metal zero prime layer MOP:L16b is added between the metal zero layer M0:L15 and the first metal layer MET1:L19, as compared with the structure of 5a shown in FIG. 5. The metal zero layer M0 and the metal zero prime layer MOP are formed by a metal damascene process using metal such as tungsten etc. The metal damascene process has replaced earlier conventional method (e.g., electroplating or chemical vapor deposition (CVD)) for fabricating interconnectors in semiconductors.

The details for the metal damascene process appropriately used in forming of a micro pattern are well known in the art, thus the detailed description for the damascene process will be omitted.

Figure 4A:
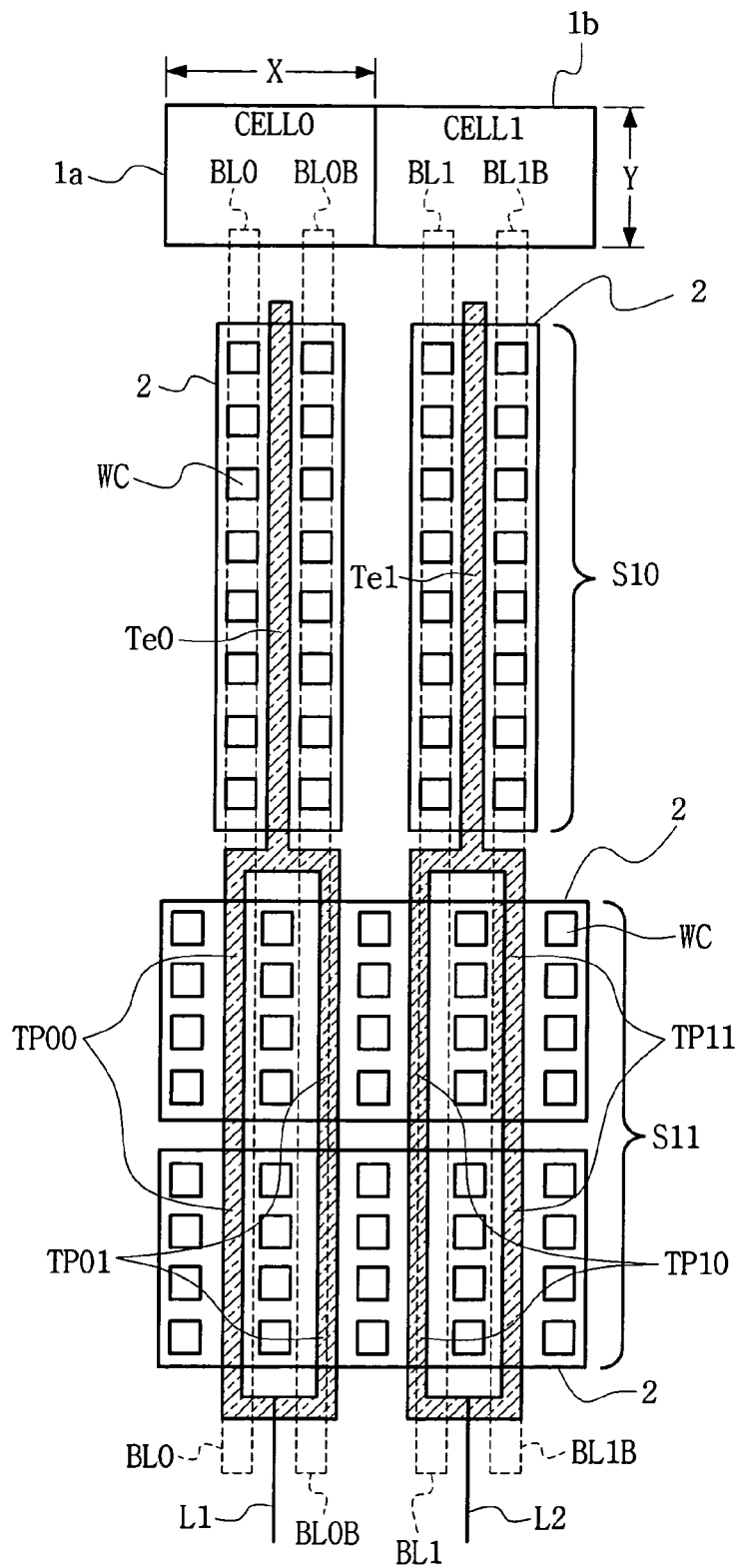
FIGS. 4A and 4B are plan views illustrating the conventional layout of the circuit shown in FIG. 2.
Figure 4B:
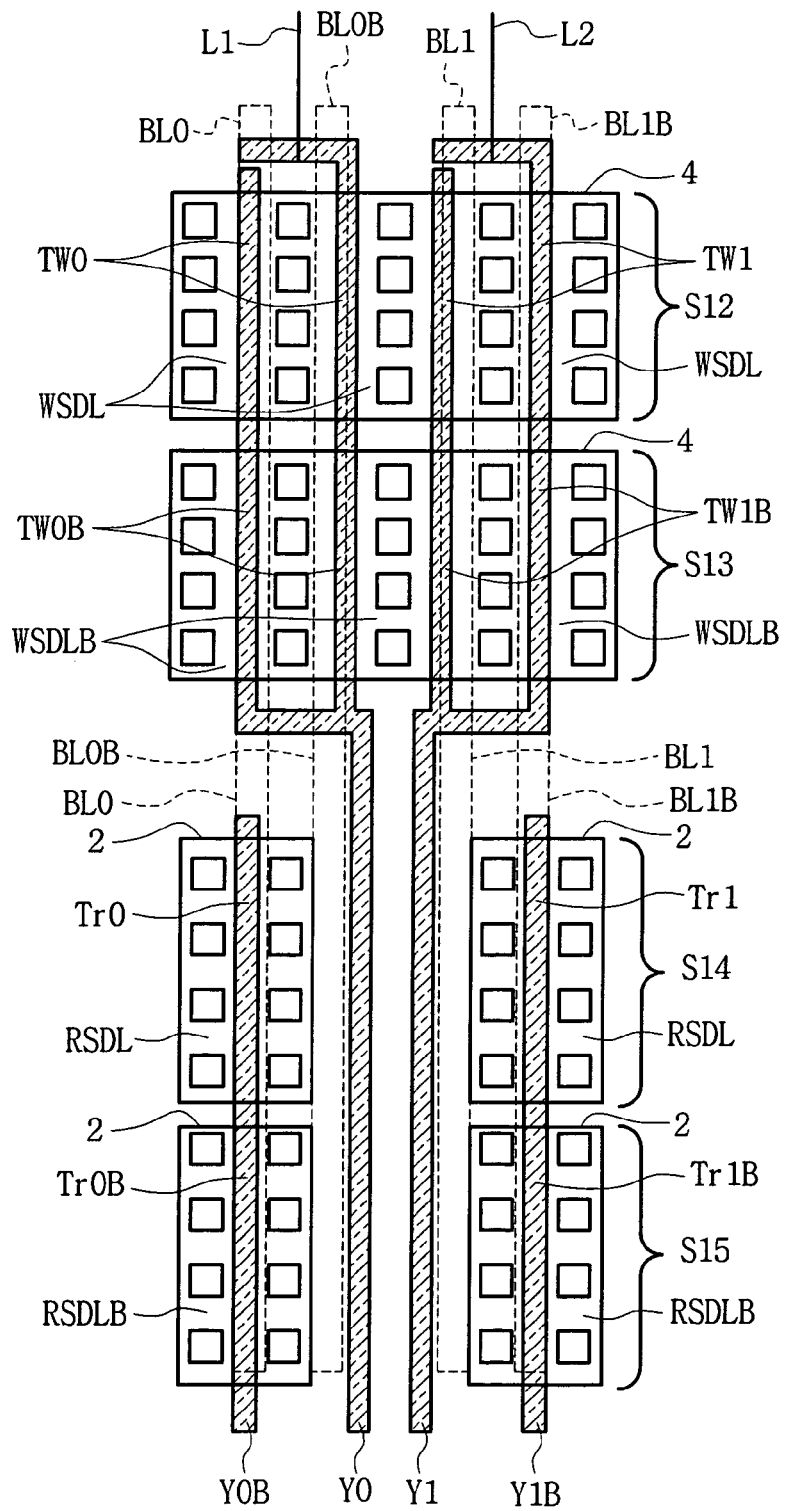

The first exemplary embodiment of the invention shown in FIG. 6 solves problems found in the conventional technology of FIGS. 4A and 4B, for a layout of column path transistors having a reduced cell pitch size and for a column fail from a silicide process.

Referring to FIG. 6, memory cells 1a and 1b mutually adjacent in a cell region individually correspond to memory cells 1a and 1b of FIG. 2. One equalization transistor Te0 and two precharge transistors Tp00 and Tp01 are formed in P-type (semiconductor) active regions 2a and 2b in a second (Y) direction. The equalization transistor Te0 is formed of three gate patterns that are in parallel, disposed in a second (Y) direction, within the region 2a; the precharge transistors Tp00 and Tp01 are formed in a portion of the region 2a and in the region 2b. For example, a gate poly of the precharge transistor Tp00 is provided as the sum of a pattern of a westernmost (leftmost) position in the regions 2a and 2b and of a left half pattern formed in the region 2b. Similarly to the forgoing, a reference symbol WC indicates a tungsten contact; the first and second bit line pairs BL0-BL0B and BL1-BL1B are represented as dotted lines (rectangles elongated) along the second (Y) direction. A gate layer formed of polysilicon is represented as a solid line hatched in a diagonal pattern along the second (y) direction. For convenience, the bar-type patterns of gate layers of the equalization transistor Te0 and the precharge transistors Tp00 and Tp01 are labeled with remote reference characters connected through use of plural (curved) lines.

First equalization and precharge MOS transistors Te0, Tp00 and Tp01 are formed in the regions 2a and 2b of a peripheral circuit region (spanning dimension S20 in the second (Y) direction) adjacent to a cell region where the memory cells are formed, and are connected to the first bit line pair BL0, BL0B corresponding to first static RAM memory cell 1a. In the regions 2a and 2b, the first bit line pair BL0, BL0B is formed of a first metal layer M1, but the second bit line pair BL1, BL1B is formed of a layer different from the first metal layer M1.

In the peripheral circuit region (spanning dimension S20 in the second (Y) direction), second equalization and precharge MOS transistors Te1, Tp10 and Tp11 are formed in regions 2c and 2d which are further distanced from the cell region in the second (Y) direction); the regions 2c and 2d being separated by (a level of) the regions that the first equalization and precharge MOS transistors Te0, Tp00 and Tp01 are formed in. The transistors Te1, Tp10 and Tp11 are connected with the second bit line pair BL1, BL1B corresponding to the second static RAM memory cell 1b. The equalization transistor Te1 is formed of three mutually parallel gate patterns disposed in the second (Y) direction (in the region 2c), and the precharge transistors Tp10 and Tp11 are formed in a portion of the region 2c and in the region 2d. For example, a gate poly of precharge transistor Tp10 is provided as the sum of a pattern of a westernmost (leftmost) position in the regions 2c and 2d and of a left half pattern formed in the region 2d.

In N-type active regions 4a and 4b, first and second write path transistor pairs Tw0, Tw0B, and Tw1, Tw1B are formed. The first and second write path transistor pairs Tw0, Tw0B and Tw1, Tw1B are respectively connected with first bit line pair BL0,BL0B and the second bit line pair BL1, BL1B corresponding to the first and second static RAM memory cells 1a and 1b.

In P-type active regions 2e and 2f, first and second read path transistor pairs Tr0, Tr0B and Tr1, Tr1B are formed. The first and second read path transistor pairs Tr0, Tr0B and Tr1, Tr1B are respectively connected with first bit line pair BL0, BL0B and second bit line pair BL1, BL1B corresponding to the first and second static RAM memory cells 1a and 1b.

In FIG. 6, a first metal wiring layer Y0L transmitting a first column decoding signal Y0 is electrically connected by a contact C01 to a gate layer in region 2b after passing through regions 2f, 2e, 4b, 4a, 2d and 2c in a second (Y) direction, and by a contact C03 to a gate layer in region 4b after passing through regions 2f and 2e. The first metal wiring layer Y0L (transmitting a first column decoding signal Y0) is commonly connected with polysilicon gate layers of the first equalization and precharge MOS transistors Te0, Tp00 and Tp01 and with a polysilicon gate layer of the first write path transistor pair Tw0, Tw0B, as indicated in FIG. 2. According to the first exemplary embodiment of the invention, the first metal wiring layer Y0L is formed of the metal zero prime layer MOP; L16b shown in FIG. 5. The metal zero prime layer MOP:L16b is a metal damascene layer formed on the metal zero layer M0. It is preferable that the metal layers (e.g., metal zero layer M0 and metal zero prime layer MOP) are each formed of tungsten (W) metal or of a metal selected from the group consisting of tungsten, aluminum, copper, cobalt, rhodium, iridium, nickel, palladium, platinum, copper, silver and gold, alloys thereof and mixtures thereof.

Meanwhile, a second metal wire Y1L (transmitting a second column decoding signal Y1) is commonly connected by a contact C02 to a gate layer in region 2d after passing through regions 2f, 2e, 4b and 4a in a second (Y) direction, and by a contact C04 to a gate layer of a region 4b after passing through regions 2f and 2e. The second metal wire Y1L is commonly connected to polysilicon gate layers of the second equalization and precharge MOS transistors Te1, Tp10 and Tp11 and to a polysilicon gate layer of the second write path transistor pair Tw1, Tw1B, as indicated in FIG. 2. The second metal wire Y1L is formed of a metal zero prime layer MOP:L16b shown in FIG. 5.

In comparing FIG. 6 with FIGS. 4A and 4B, wiring lines in FIG. 6 are not formed as gate poly, and do not have an active device isolation region as shown in FIG. 4B, thus a size is reduced in a first direction as an X direction. Hence, it is relatively easy to dispose column path transistors in a cell pitch size of scaled-down memory cell.

In comparing the first and second metal wires Y0L and Y1L formed in a damascene process of a metal such as tungsten with corresponding wires (lines) of FIG. 4B, the wires are not formed in a silicide process, which solves a problem of wiring resistance caused in fail of the silicide process. The resistance value of metal wires formed in a tungsten damascene process is smaller about five times than the gate poly, and thus, a column fail problem caused in the silicide process can be avoided.

Further, in the circuit layout referred to in FIGS. 4A and 4B a pattern variation of a polysilicon layer is severe in every region in a second (Y) direction, but in FIG. 6 the variation of a critical dimension of a gate poly is small and this advantageously facilitates photolithography. The embodiment of FIG. 6 assures process reliability as compared with the conventional art of FIGS. 4A and 4B even in the silicide process, and considerably improves manufacturing yield. In other words, production efficiency may be increased while attaining high performance, small area and a photolithography-friendly layout.

Figure 7:
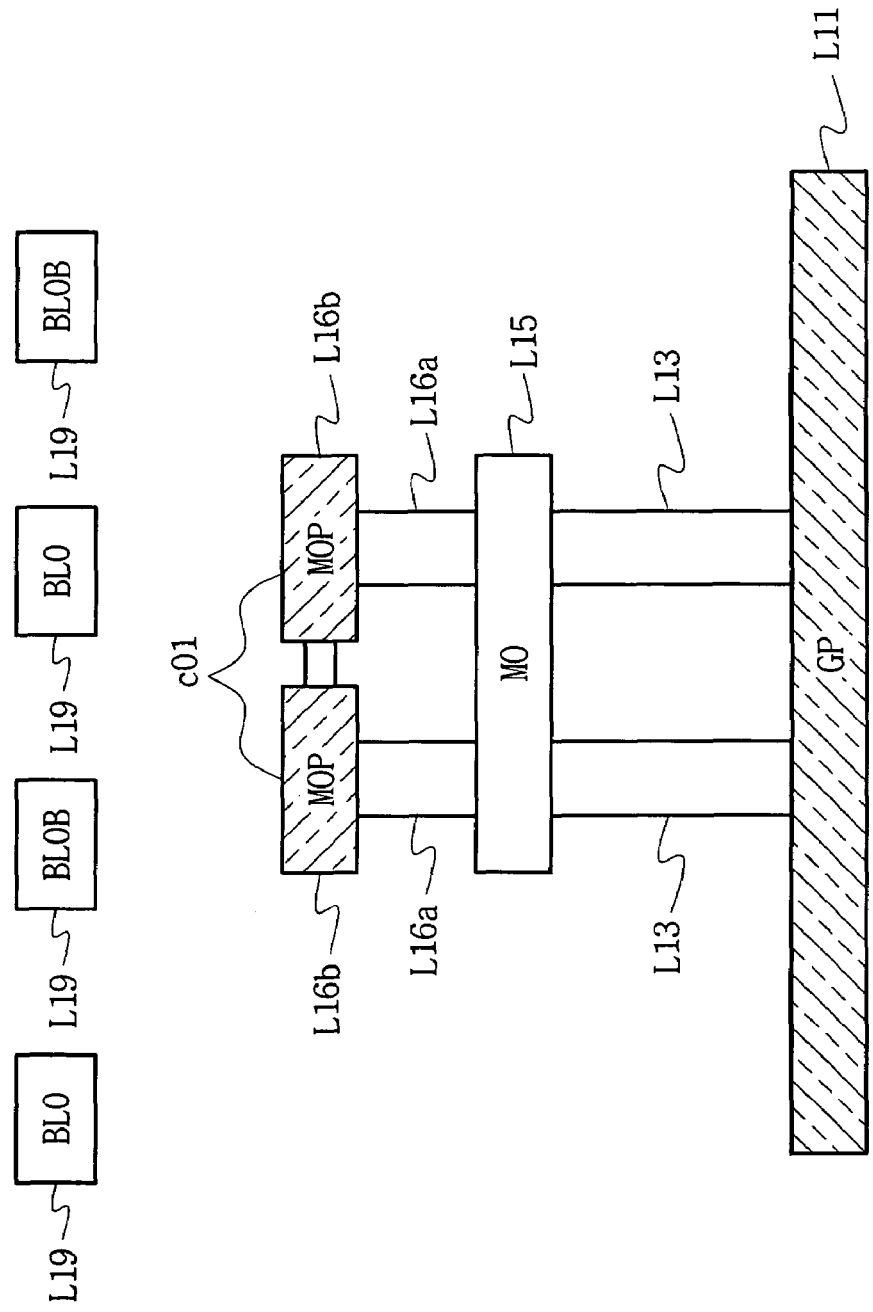
FIG. 7 is a longitudinal sectional view taken along section line A-A' of FIG. 6.

FIG. 7 is a section view along section line A-A' of FIG. 6. With reference to FIG. 7, the first metal wire Y0L is formed of a metal zero prime layer MOP:L16$b$, and is connected to a metal zero layer M0:L15 through a contact L16$a$. A first metal layer MET1:L19 is formed on an insulation layer over the metal zero prime layer MOP:L16$b$. The first metal layer L19 becomes (forms, comprises) the first bit line pair BL0, BL0B. A gate poly layer L11 is connected to the metal zero layer M0:L15 through a contact L13. Herewith, the metal zero prime layer MOP:L16$b$ serving as the first metal wiring layer (e.g., forming the metal wire Y0L) may be connected directly to the gate poly layer L11 through a contact without an interposition of the metal zero layer M0:L15.

Thus, in the structure shown in FIG. 6, all the column path transistors share a source per one input/output port, and a device isolation film pattern is not specifically formed, and the pitch of all the transistors is equal. The column path transistors respectively have two or more (at least two) polysilicon gate layers (of a "finger" type), and a precharge transistor and an equalization transistor connected to the bit line pair, sharing one source or drain junction region, and also sharing a source region with its adjacent transistors. The pitches of transistors constituting the column path transistors are uniform per transistor group.

According to the first exemplary embodiment of the invention, when a column selection signal (provided as an input of a write path transistor and of precharge and equalization transistors that constitute a column (Y) gating block), is outputted from a column selection part and is provided commonly to the transistors through a metal wire (line); the metal wire (line) has a structure of being disposed as a specific metal zero prime (MOP) layer regardless of a gate poly layer or metal zero layer (MO). Thus, a peripheral circuit region adjacent to a memory cell region can have a smaller layout area, and a circuit wiring layout in the peripheral circuit region can be smooth, and one of the speed limit factors in a write operation can be mitigated. Transistors constituting the column (Y) gating block can be formed more efficiently, and the (resistive) loading for column decoding signal lines of the column (Y) gating block is substantially reduced.

In the second exemplary embodiment of the invention the transistors constituting a row decoder section (a portion of the row decoder; see FIG. 8), and wiring layers necessary for operation of the row decoder section, are disposed appropriately for the cell pitch of a high-integrated memory cell.

Figure 1:
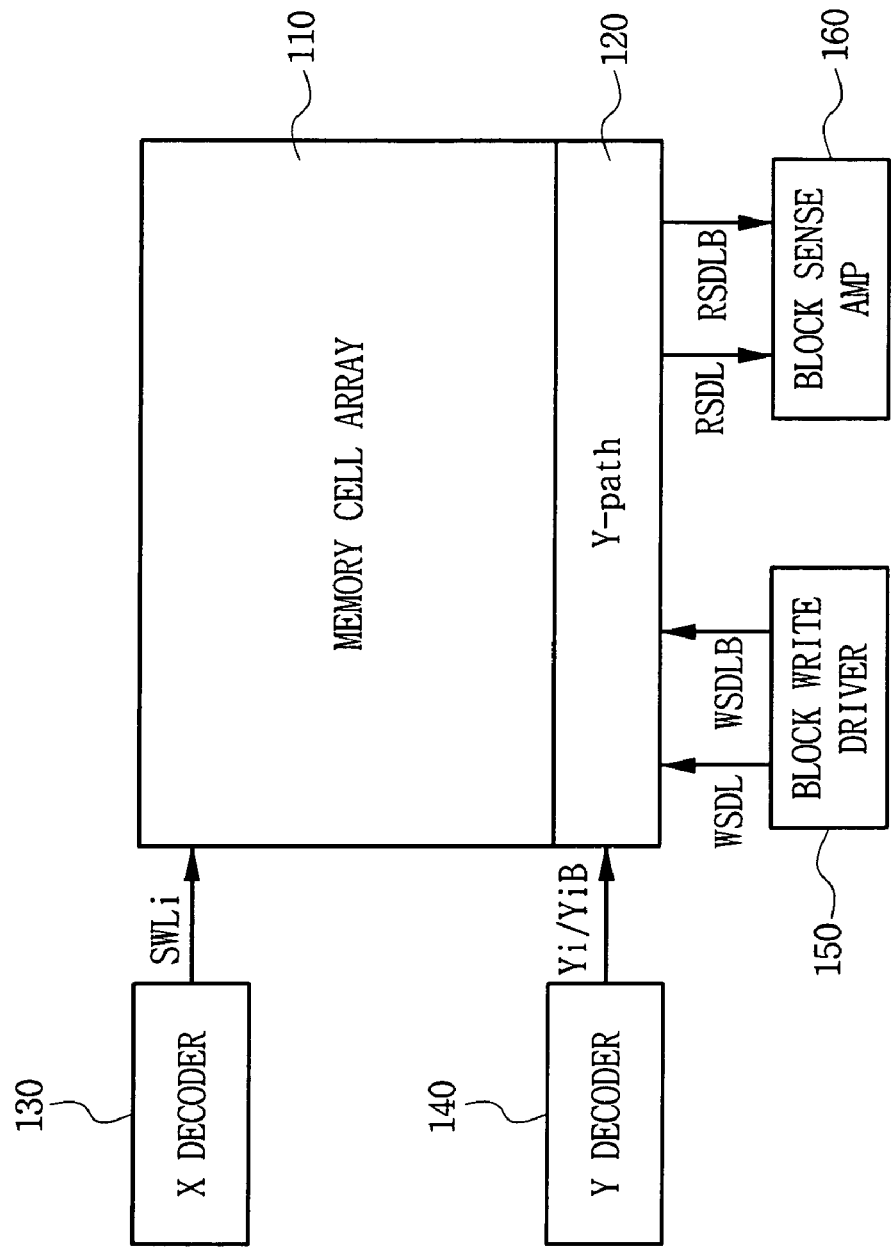
FIG. 1 is a block diagram illustrating a semiconductor memory device and its memory cell array and its peripheral circuit blocks.
Figure 8:
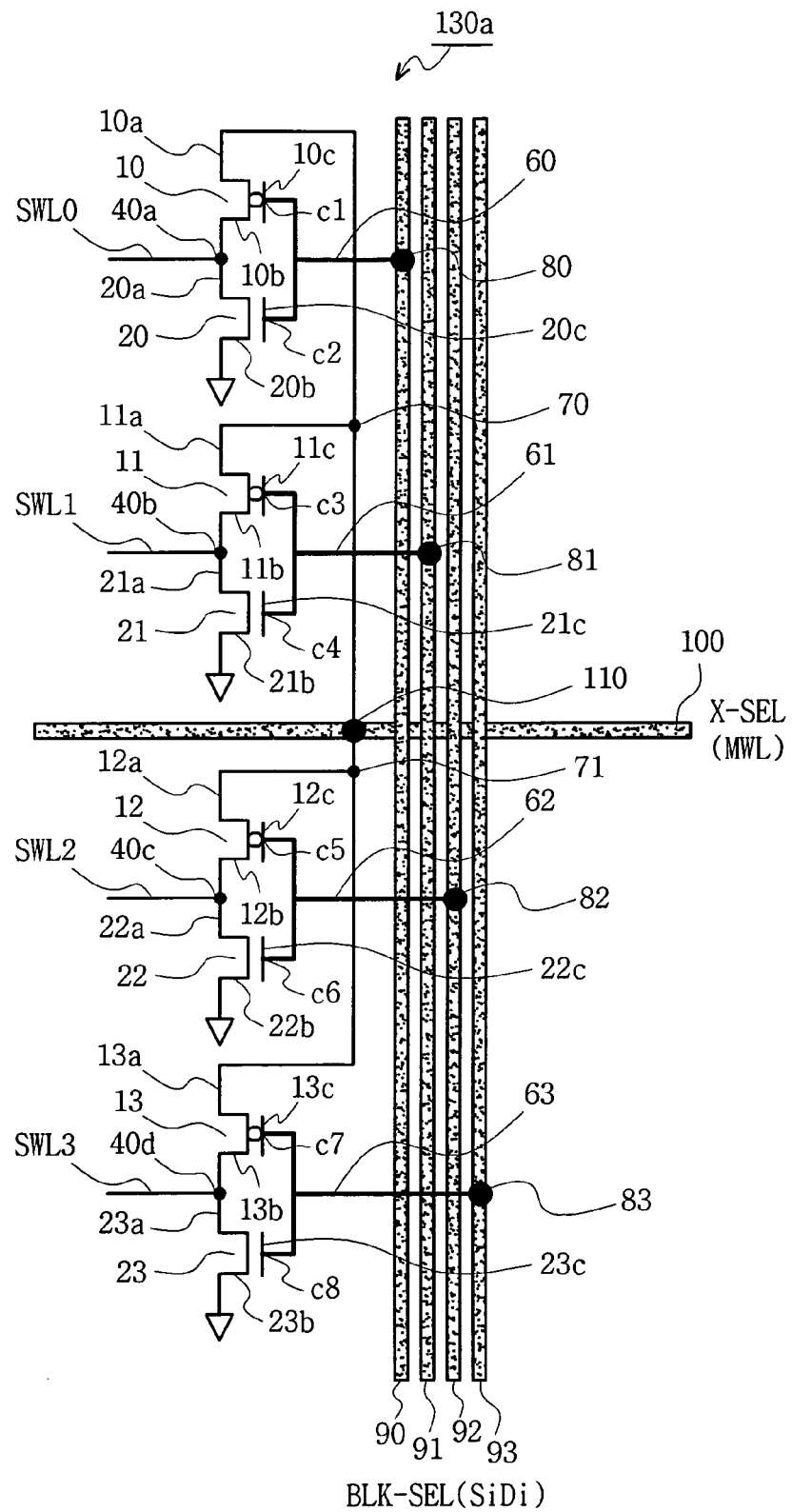
FIG. 8 is a general circuit diagram illustrating a section of the row (X) decoder shown in FIG. 1.

The circuit wiring structure of FIG. 8 is a typical row decoder section 130$a$ of the X decoder 130 shown in FIG. 1. Referring to FIG. 8, P-type and N-type transistors 10, 11, 12, 13 and 20, 21, 22, 23 connected to one corresponding main word line MWL:100 and four block selection lines SiDi constitute four (inverting) drivers.

Figure 9:
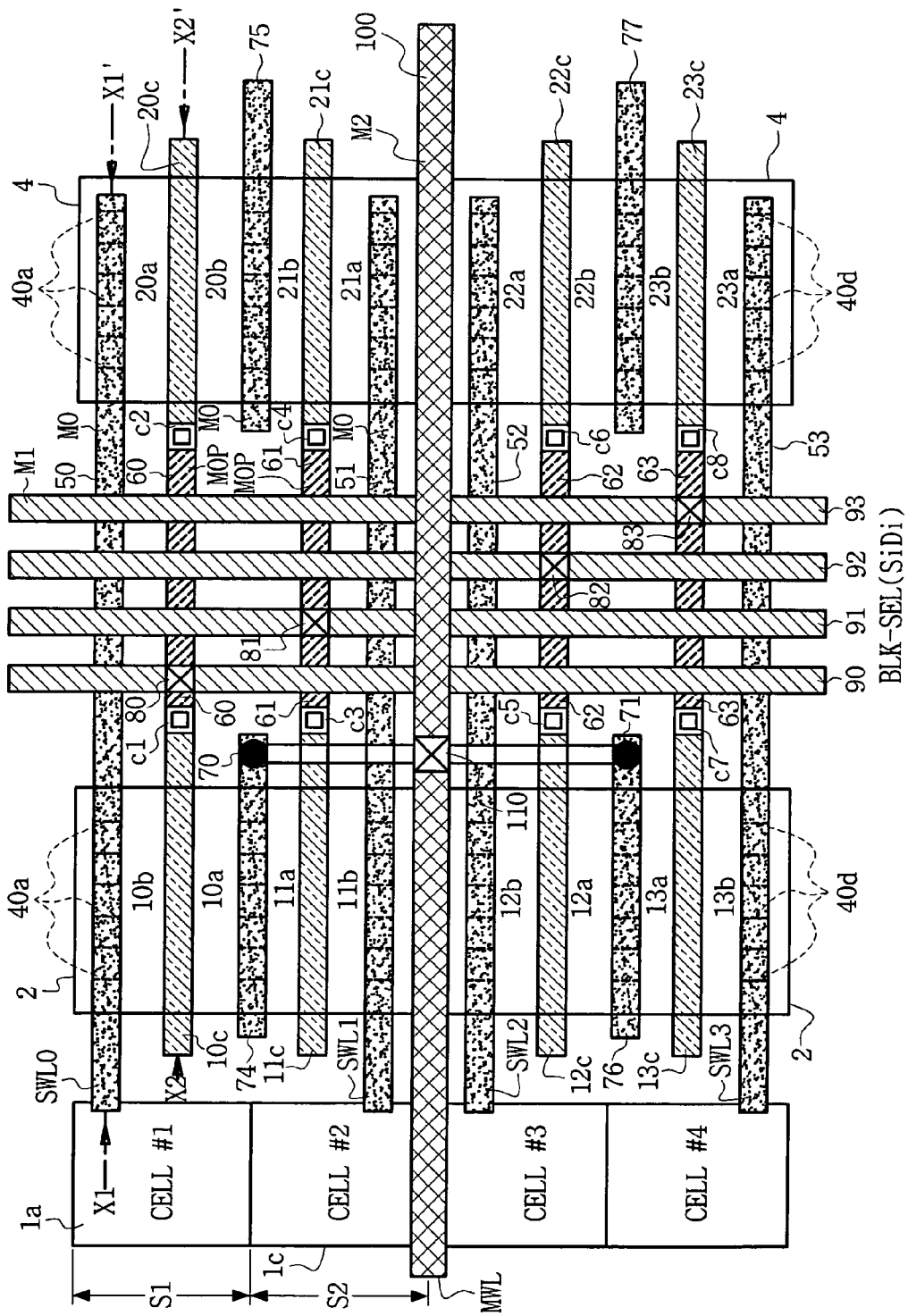
FIG. 9 is a plan view illustrating an implementation of a section of the row (X) decoder shown in FIG. 8 according to an exemplary embodiment of the invention.

The second exemplary embodiment of the invention provides a layout shown in FIG. 9. As shown in FIG. 9, P-type transistors 10, 11, 12, 13 and N-type transistors 20, 21, 22, 23 constitute the (inverting) drivers, and its input/output wiring lines, are disposed matching to a reduced cell pitch of memory cells.

The cell pitch of memory cells connected with subword lines SWL0-SWL3 is reduced more, and in this case, a more efficient layout for input lines 60, 61, 62 and 63 of drivers connected to a corresponding block selection signal SiDi among selection signals of FIG. 8 provides the peripheral circuit region having a smaller occupation area.

Referring to FIG. 9, a circuit wiring layout is illustrated in a line-symmetrical structure centered on a main word line 100. First and second static RAM memory cells 1$a$ and 1$c$ mutually adjacent in a vertical direction (in a first direction, X) are formed in a memory cell region (see memory cell array 110 of FIG. 1). This first direction (X) is independent of the first direction used as an example in the first exemplary embodiment. The second SRAM memory cell 1$c$ is a cell positioned in a direction different from the memory cell 1$b$ of the first exemplary embodiment.

First and second P-type MOS transistors 10 (10$a$ & 10$b$) and 11(11$a$ & 11$b$) shown in FIG. 8 are formed (as illustrated in FIG. 9) in a region 2 of a peripheral circuit region approximate to (e.g., adjacent to) the memory cell region, in a second direction (Y) (same direction as the main word line MWL layout direction) orthogonal (perpendicular) to the first direction (X). The first and second P-type MOS transistors 10 (10$a$ & 10$b$) and 11(11$a$ &11$b$) are disposed to switchably connect between a first branch 74 of the main word line MWL and the corresponding first and second subword lines SWL0 and SWL1 (of the first and second SRAM memory cells 1$a$ and 1$c$).

First and second N-type MOS transistors 20 (20$a$ & 20$b$) and 21 (21$a$ & 21$b$) are distanced (separated), by a predetermined distance, from the region 2 where the first and second P-type MOS transistors 10 (10$a$ & 10$b$) and 11 (11$a$ & 11$b$) are formed (also disposed, elongated in the second direction, Y), in a region 4 of the peripheral circuit region. First and second N-type MOS transistors 20 (20$a$ & 20$b$) and 21 (21$a$ & 21$b$) are respectively disposed to switchably connect the first and second subword lines SWL0 and SWL1 to ground line 75. Ground lines 75 and 77 may be formed of the metal zero layer.

A first metal damascene wire (line) 60 (extending in the second Y direction) corresponding to the common gate line/node having reference number 60 of FIG. 8 is formed in a metal zero prime layer MOP to connect between a gate poly (layer) 10$c$ of the first P-type MOS transistor 10 and a gate poly (layer) 20$c$ of the first N-type MOS transistor 20, in the peripheral circuit region shown in FIG. 9. The metal zero prime layer MOP is positioned on a metal zero layer M0 in which the first and second subword lines SWL0 and SWL1 are formed.

A second metal damascene wire (line) 61 (extending in the second Y direction) corresponding to the common gate node/line having reference number 61 in FIG. 8 connects between a gate poly (layer) 11c of the second P-type MOS transistor 11 and a gate poly (layer) 21c of the second N-type MOS transistor 21, in the peripheral circuit region of FIG. 9. The second metal damascene wire (line) 61 is disposed in parallel with and on the same (metal) layer as the first metal damascene wire (line) 60.

In FIG. 9, reference symbols 40a and 40d shown on sub-word lines indicate tungsten contacts WC for electrically connecting between gate poly (GP) 10c, 20c and the metal zero layer M0, and contacts c1 through c8 connect between the gate poly GP and a metal zero prime layer M0P, and their functions respectively correspond to the elements of FIG. 8 having the same reference symbols.

Figure 10:
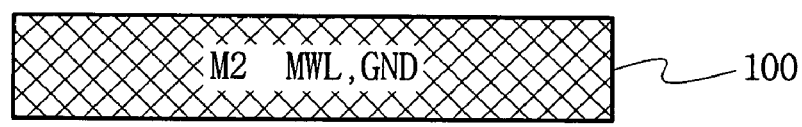
FIG. 10 is a diagram illustrating the vertical arrangement of layers used in FIG. 9.
Figure 10:
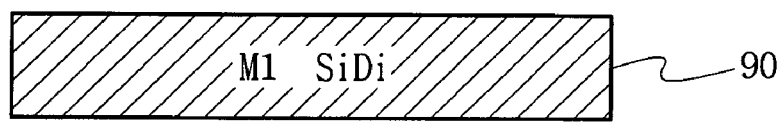
Figure 10:
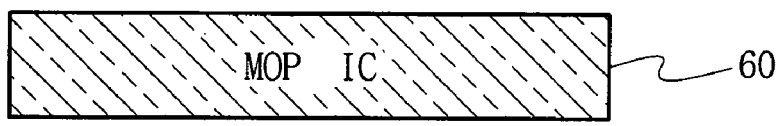
Figure 10:
Figure 10:
Figure 10:
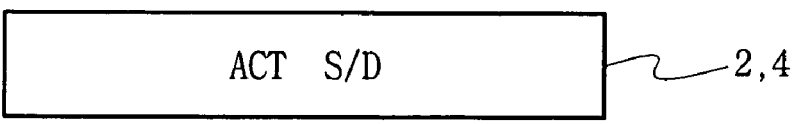

FIG. 10 schematically illustrates the vertical arrangement of the layers used in FIG. 9. Referring to FIGS. 9 & 10, active regions 2 and 4 implementing the source, channel and drain regions of (inverting) driver transistors are disposed on (e.g., directly on) a semiconductor substrate. The gate poly layers (GP) 10c, 20c is disposed over the channel regions to function as the gates of the (inverting) driver transistors. Disposed sequentially upon the gate poly layers 10c, 20c, a metal zero layer 50 implementing the subword lines SWLi (e.g., SWL0, SWL1, SWL2, SWL3), and a metal zero prime layer 60 implementing an intraconnection (IC) wiring layer, a first metal layer 90 to implement a wire transmitting a block selection signal, and a second metal layer 100 to implementing a main word line MWL or power wiring line.

Figure 11:
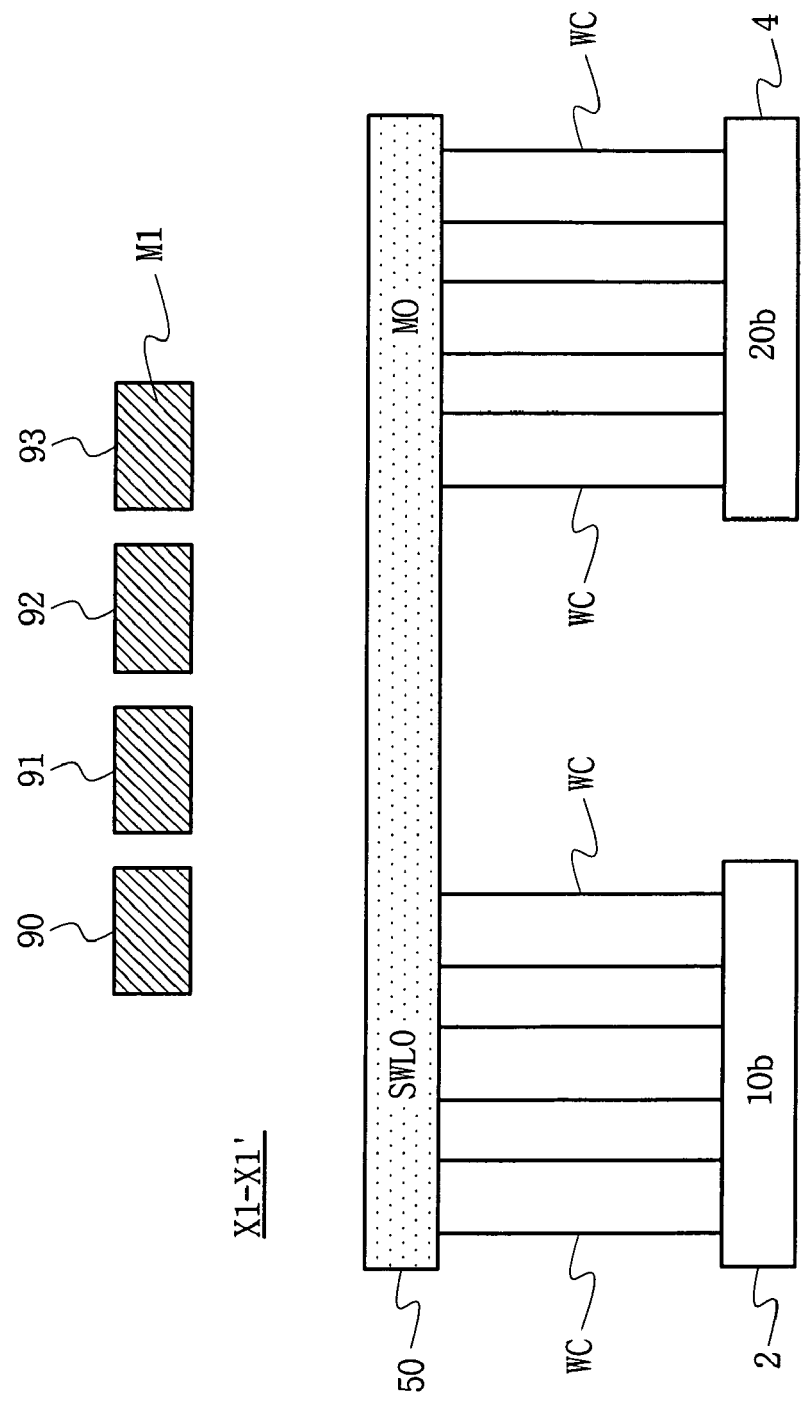
FIG. 11 is a section view taken along section line X1-X1' shown in FIG. 9.
Figure 12:
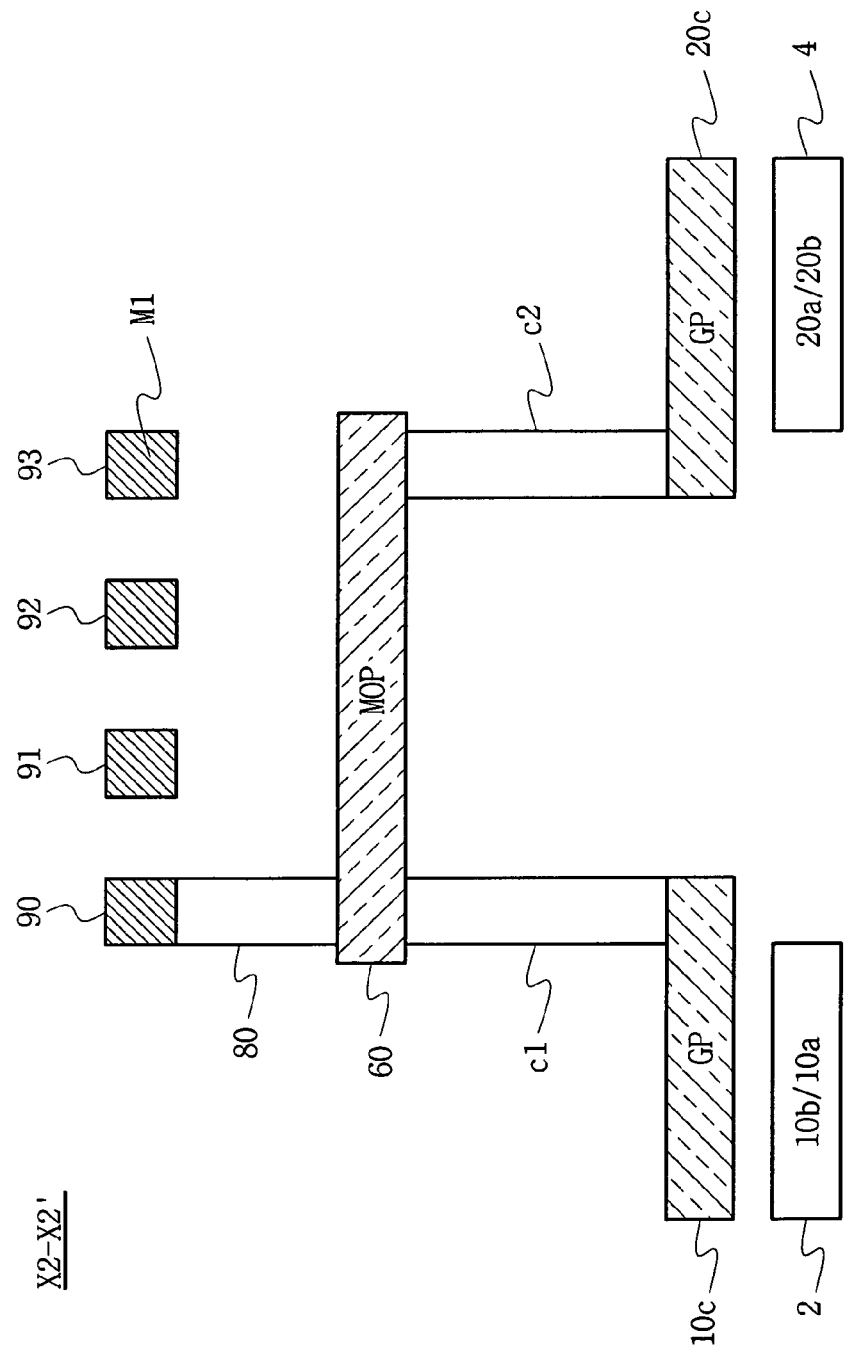
FIG. 12 is a section view taken along section line X2-X2' shown in FIG. 9.

FIG. 11 is a section view taken along the section line X1-X1' shown in FIG. 9; and FIG. 12 is a section view taken along the section line X2-X2' shown in FIG. 9.

Referring first to FIG. 11, a first subword line 50:SWL0 formed of (comprising) a metal zero layer M0 is connected with a drain 10b of the first P-type MOS transistor 10 (in active region 2) and the drain 20b of the first N-type MOS transistor 20 (in active region 4) through tungsten contacts WC positioned in (beneath) the first subword line. Four orthogonal wires 90, 91, 92, 93 (comprising first metal layer M1) transmitting block selection signals BLK-SEL (SiDi) are disposed above the first subword line 50. The metal zero prime layer M0P is not explicitly shown in FIG. 11 since FIG. 11 depicts the section view taken along section line X1-X1' shown in FIG. 9.

FIG. 12 shows the metal wire (line) 60 of FIG. 9 formed as a metal zero prime layer M0P. The wire (line) 60 is a tungsten damascene wiring layer positioned between a subword line (not shown in section view) and block selection lines 90, 91, 92 & 93 (between bit lines). The metal zero prime layer M0P is connected to gate poly layers 10c and 20c of P-type and N-type (inverting, driver) transistors through contacts c1 and c2. In other cases, the metal zero prime layer M0P may be connected to the gate poly layers 10c and 20c through a metal zero layer M0. A contact 80 formed on the metal zero prime layer M0P is connected to one of the block selection signal lines (block selection signal line 90) formed of a first metal layer M1.

In forming the wires (lines) 60 and 61 as the metal zero prime layer M0P, the layout between the first and second word lines SWL0 and SWL1 in the first direction has a much wider margin than the conventional case of disposing the wiring lines as a metal zero layer M0. In reducing memory cell pitch in the first direction, also a layout of transistors of a row decoder section and wires (lines) in the peripheral circuit region can be disposed more efficiently in a limited size.

In the second exemplary embodiment, wires (to be connected with the polysilicon gate layers of (driver) transistors constituting a core circuit part of the peripheral circuit region adjacent to a memory cell region) are formed on a sub word line formed in a first damascene process, by using a metal layer formed by a second damascene process; thereby circuit wiring layers necessary for operation of the transistors can be disposed appropriately having the cell pitch of memory cells highly-integrated in two dimensions or three dimensions.

Accordingly, in the second exemplary embodiment, interconnection metal wires connected between polysilicon gate (gate poly) layers of transistors constituting a section of a row decoder circuit provided corresponding to each bit line pair, by using a metal layer formed by a second damascene process, on a subword line formed in a first damascene process; thus two upper and lower row decoder sections are respectively disposed in a line-symmetrical structure centering on the main word line, and patterns of gate poly layers of four transistors constituting a row decoder section are disposed with the same interval. Thus, a photolithograph friendly gate pattern is provided, having the potential to improve manufacturing yield.

Meanwhile, the exemplary row decoder section circuit was described above as an inverter type, but the second exemplary embodiment of the invention may be adapted to implement a NOR-type row decoder section circuit.

In the second exemplary embodiment, transistors constituting a row decoder section can be disposed in a limited size more efficiently, and circuit wiring layers necessary for control and operation of the transistors can be arranged appropriately having the cell pitch of memory cells highly-integrated in two dimensions or three dimensions.

As described above, according to a circuit wiring layout of the invention, a peripheral circuit region adjacent to a memory cell region can be realized with a smaller footprint area.

In addition, the circuit wiring layout provides a smooth circuit wiring in a peripheral circuit region adjacent to a memory cell region of a semiconductor memory, and solves one of the speed limiting problems in a write operation. Transistors constituting a column (Y) gating block are disposed more efficiently, thus substantially reducing the loading of column decoding signal lines. Transistors of a row decoder section, and wiring layers necessary for the control and operation of the row decoder section, can be formed corresponding with the memory cell pitch of highly-integrated memory cells. Transistors of a column (Y) gating block, and transistors of a row decoder section, can be disposed in a limited size more efficiently, and having circuit wiring layers necessary for control and operation of the transistors, can be formed appropriately to have the cell pitch of memory cells high-integrated in two or three-dimensions.

While the present invention has been particularly shown and described with reference to exemplary embodiments thereof, it will be understood by those skilled in the art that various changes in form and details may be made therein without departing from the spirit and scope of the present invention as defined by the appended claims. For example, the proposed number of word line drivers shown in exemplary embodiments of the invention may be varied, and many other variations may be provided by a circuit designer skilled in the art. Further, for example, the first exemplary embodiment may be changed to form a wiring layer of signals other than a column decoding signal, as a metal zero prime layer; and the second exemplary embodiment may be varied to form an other circuit wiring layer other than a section row decoding related signal, as a metal zero prime layer. In addition, though the metal zero prime layer was described as being a metal damascene wiring layer, it may be realized by another layer. Accordingly, these and other changes and modifications are within the true spirit and scope of the invention as defined by the appended claims.

What is claimed is:

1. A semiconductor memory device comprising:
a memory cell region, including first and second memory cells disposed adjacent to each other in a first direction and having a common word line,
a peripheral circuit region proximate in a second direction to the memory cell region, comprising a plurality of field effect transistors (FETs) having their respective sources, channels and drains formed in a semiconductor layer;
a first bit line and a first complementary bit tine connected to the first memory cell and extending in the second direction to the peripheral circuit region formed in a bit line metal layer;
a second bit line and a second complementary bit line connected to the second memory cell and extending in the second direction to the peripheral circuit region formed in the bit line metal layer;
a first equalization PET formed in the peripheral circuit region and electrically connected to and between the first bit line and the first complementary bit line, wherein a portion of the first equalization FET is overlapped by at least one of the second bit line and the second complementary bit line;
a second equalization EEl formed in the peripheral circuit region and electrically connected to and between the second bit line and the second complementary bit line, wherein a portion of the second equalization EEl is overlapped by at least one of the first bit line and the first complementary bit line;
a gate layer including the gate electrodes of the field effect transistors (FETs); and
a first metal wiring line configured to transmit electrical signals in the second direction to the gate electrode of the first equalization FET; and
a second metal wiring line configured to transmit electrical signals in the second direction to the gate electrode of the second equalization FET.

2. The device of claim 1, wherein the first metal wiring line overlaps at least a portion of the second equalization FET.

3. The device of claim 1, wherein the transistors formed in the peripheral circuit region are P-type transistors implementing a column (Y) gating block.

4. The device of claim 1, wherein the gate layer is formed of polysilicon, and each of the first metal wiring line and the second metal wiring line is formed of tungsten.

5. The device of claim 1, wherein the first metal wiring line transmits a column decoding signal to the gate electrode of the first equalization FET.

6. The device of claim 1, wherein the first metal wiring line and the second metal wiring line are formed in a metal wiring layer formed under a bit line layer including the first bit line, the first complementary bit line, the second bit line, and the second complementary bit line.

7. The device of claim 6, wherein the first metal wiring line underlaps the first complementary bit line.

8. The device of claim 1, further comprising:
a first read path FET, connected to the first bit line, formed in the peripheral circuit region; and
a second read path FET, connected to the first complementary bit line, formed in the peripheral circuit region;
wherein a portion of each of first read path FET and of the second read path FET is overlapped by the first bit line, and wherein another portion of each of first read path FET and of the second read path FET is overlapped by the first complementary bit line.

9. A semiconductor memory device comprising:
first and second SRAM (Static Random Access Memory) memory cells disposed adjacent to each other in a first direction within a memory cell region;
first and second equalization transistors formed in a peripheral circuit region proximate in a second direction to the memory cell region and respectively connected to first and second bit line pairs corresponding to the first and second static RAM memory cells, wherein the first bit line pair includes a first bit line and a first complementary bit line connected to the first SRAM, and wherein the second bit line pair includes a second bit line and a second complementary bit line connected to the second SRAM,
and wherein the first equalization transistor corresponding to the first bit line pair is overlapped by one of the second bit line and the second complementary bit line.

10. The device of claim 9, wherein the second equalization transistor corresponding to the second bit line pair is overlapped by one of the first bit line and the first complementary bit line.

11. The device of claim 9, further comprising:
a first metal wiring line extending in the second direction and configured to transmit a first column decoding signal to the gate electrodes of the first equalization transistor and of the first precharge transistors, and formed above the gate layer that includes the gate electrodes; and
a second metal wiring line extending in the second direction, configured to transmit a second column decoding signal to the gate electrodes of the second equalization transistor and of the second precharge transistors, and formed above the gate layer that includes the gate electrodes.

12. The device of claim 9, wherein the second equalization transistor is further away from the memory cell region than the first equalization transistor.

13. The device of claim 12, further comprising:
a pair of first write path transistors formed adjacent to each other in the second direction within the peripheral circuit region, respectively connected to the first bit line and to the first complementary bit line.

14. The device of claim 13, further comprising:
a first metal wiring line, extending in the second direction, , configured to transmit a first column decoding signal to the gate electrodes of the first equalization transistor and of the first precharge transistors and of the first write path transistor pair, formed at a higher layer than a gate layer that includes the gate electrodes; and
a second metal wiring line, extending in the second direction on the same layer as the first metal wiring layer, and configured to transmit a second column decoding signal to the gate electrodes of the second equalization transistor and of the second precharge transistors and of the second write path transistor pair.

15. The device of claim 14, wherein the first equalization transistor and the first precharge transistors include polysilicon gate electrodes of a finger type.

16. The device of claim 14, wherein the first and second metal wiring lines are formed of a tungsten metal layer formed under a layer comprising a first bit line and a first complementary bit line connected to the first equalization transistor and to the first precharge transistors.

17. The device of claim 14, wherein the first and second metal wiring lines are formed of a metal layer formed in a second damascene process on a subword line layer formed in a first damascene process.

18. The device of claim 9, further comprising:
first precharge transistors, corresponding to the first bit line pair, formed in the peripheral circuit region; and
second precharge transistors, corresponding to the second bit line, formed in the peripheral circuit region;
wherein one of the first precharge transistors corresponding to the first bit line pair is overlapped by at least one of the second bit line and the second complementary bit line.

19. The device of claim 9, further comprising:
a pair of first read path transistors, formed in the peripheral circuit region, respectively connected to the first bit line and to the first complementary bit line,
wherein each of the first read path transistors is overlapped by both the first bit line and the first complementary bit line.

20. A semiconductor memory device wherein column selection signals are transmitted to gate of precharge and equalization transistors through wiring lines formed in a metal layer different from a gate layer that includes gate electrodes of the precharge and equalization transistors, comprising:
a memory cell region, including first and second memory cell disposed adjacent to each other in a first direction and having a common word line,
a peripheral circuit region proximate in a second direction to the memory cell region;
a first bit line and a first complementary bit line connected to the first memory cell and extending in the second direction to the peripheral circuit region formed in a bit line metal layer;
a second bit line and a second complementary bit line connected to the second memory cell and extending in the second direction to the peripheral circuit region formed in the bit line metal layer;
a first equalization transistor formed in the peripheral circuit region and electrically connected to and between the first bit line and the first complementary bit line, wherein a portion of the first equalization transistor is overlapped by at least one of the second bit line and the second complementary bit line;
a second equalization transistor formed in the peripheral circuit region and electrically connected to and between the second bit line and the second complementary bit line, wherein a portion of the second equalization transistor is overlapped by at least one of the first bit line and the first complementary bit line;
a first metal wiring line configured to transmit a first one of the column selection signals in the second direction to the gate electrode of the first equalization transistor; and
a second metal wiring line configured to transmit a second one of the column selection signals in the second direction to the gate electrode of the second equalization transistor.

* * * * *